US010889885B2

(12) United States Patent
Perego

(10) Patent No.: US 10,889,885 B2
(45) Date of Patent: Jan. 12, 2021

(54) METHOD FOR SURFACE DECORATION OF ARTICLES

(71) Applicant: TAPEMATIC S.P.A., Ornago (IT)

(72) Inventor: Luciano Perego, Ornago (IT)

(73) Assignee: TAPEMATIC S.P.A., Ornago (IT)

( * ) Notice: Subject to any disclaimer, the term of this patent is extended or adjusted under 35 U.S.C. 154(b) by 254 days.

(21) Appl. No.: 16/042,759

(22) Filed: Jul. 23, 2018

(65) Prior Publication Data

US 2019/0048456 A1 Feb. 14, 2019

(30) Foreign Application Priority Data

Aug. 11, 2017 (IT) .......................... 102017000093249

(51) Int. Cl.
C23C 14/18 (2006.01)
B44C 1/22 (2006.01)
B44F 1/00 (2006.01)
B44C 3/00 (2006.01)
B23K 26/352 (2014.01)
B23K 26/00 (2014.01)
C09D 5/22 (2006.01)
C09K 11/02 (2006.01)
C23C 14/34 (2006.01)

(52) U.S. Cl.
CPC ........ C23C 14/185 (2013.01); B23K 26/0006 (2013.01); B23K 26/352 (2015.10); B44C 1/228 (2013.01); B44C 3/005 (2013.01); B44F 1/00 (2013.01); C09D 5/22 (2013.01); C09K 11/025 (2013.01); C23C 14/3414 (2013.01)

(58) Field of Classification Search
CPC ... C23C 14/185; C23C 14/3414; C23C 14/14; C23C 14/08
See application file for complete search history.

(56) References Cited

U.S. PATENT DOCUMENTS

| 6,569,786 | B1 * | 5/2003 | Marsh | A62B 17/003 442/132 |
| 9,487,857 | B2 | 11/2016 | Perego | |
| 2004/0252488 | A1 * | 12/2004 | Thurk | G02B 6/0041 362/147 |
| 2007/0131949 | A1 * | 6/2007 | Liu | H01L 51/008 257/89 |
| 2008/0021381 | A1 * | 1/2008 | Lurvey | G01N 21/78 604/85 |
| 2010/0123385 | A1 * | 5/2010 | Perera | H05B 33/26 313/502 |
| 2010/0140511 | A1 * | 6/2010 | Auday | H01J 61/62 250/504 R |
| 2011/0241539 | A1 * | 10/2011 | Yan | H01L 51/5284 313/504 |
| 2012/0002396 | A1 * | 1/2012 | Tseng | F21K 9/62 362/84 |
| 2012/0161431 | A1 * | 6/2012 | Vulpius | B29C 55/18 283/85 |
| 2013/0006118 | A1 * | 1/2013 | Pan | H01L 51/5024 600/476 |
| 2014/0256078 | A1 * | 9/2014 | Jin | B28D 5/00 438/57 |
| 2017/0022599 | A1 | 1/2017 | Perego | |
| 2017/0267006 | A1 * | 9/2017 | Ikeda | B41F 16/00 |
| 2017/0349090 | A1 * | 12/2017 | Dellock | E06B 7/00 |
| 2017/0355223 | A1 * | 12/2017 | Shibahara | B32B 3/30 |

FOREIGN PATENT DOCUMENTS

| JP | 2001001444 A | 1/2001 | |
| JP | 2001062957 A | 3/2001 | |
| JP | 2007-35430 A * | 2/2007 | ............ H05B 33/02 |
| JP | 2010194429 A | 9/2010 | |
| JP | 2011020021 A | 2/2011 | |
| JP | 2012051218 A | 3/2012 | |

OTHER PUBLICATIONS

Husain, Alaa A.F., et al., "A review of transparent solar photovoltaic technologies". Renewable and Sustainable Energy Reviews, 94(2018) pp. 779-791. https://doi.org/10.1016/j.rser.2018.06.031.*
Le Donne, A., et al., "Effects of CdS Buffer Layers on Photoluminescence Properties of Cu2ZnSnS4 Solar Cells". International Journal of Photoenergy, vol. 2015, Article ID 583058, pp. 1-8. doi.org/10.1155/2015/583058.*
Koike, Katsuhiko, et al., "Multilayer transparent electrode consisting of silver alloy layer and metal oxide layers for organic luminescent electronic display device". J. Vac. Sci. Technol. A 26(3), May/Jun. 2008, pp. 444-454.*
Huang, Hongyong, et al., "Fabrication of Graphene-Metal Transparent Conductive Nanocomposite Layers for Photoluminescence Enhancement". Polymers 2019, 11, 1037, pp. 1-12. doi:10.3390/polym11061037.*
European Search Report dated Dec. 11, 2018 from counterpart European App No. 18179464.5.
European Office Action dated May 6, 2020 from counterpart European App No. 18179464.5.

* cited by examiner

Primary Examiner — Bret P Chen
(74) Attorney, Agent, or Firm — Shuttleworth & Ingersoll, PLC; Timothy J. Klima

(57) ABSTRACT

A method for surface decoration of articles comprises the following steps A), B) and C). Step A) comprises applying a base layer to the surface of a main body. The base layer comprises at least one photoluminescent additive. Step B) comprises applying on the base layer a metallization layer configured to make at least partially visible the photoluminescence of said base layer. In particular, step B) comprises a process of deposition of metal particles on the base layer. Step C) comprises applying a transparent coating layer on the base and metallization layers. The above-mentioned method allows to obtain an article with a metallic surface finishing having a luminescence effect which can be perceived especially in low light conditions or under the effect of ultraviolet light.

6 Claims, 2 Drawing Sheets

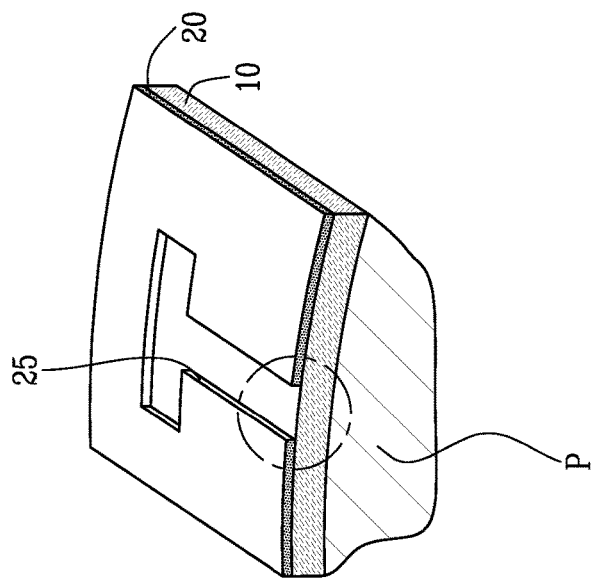
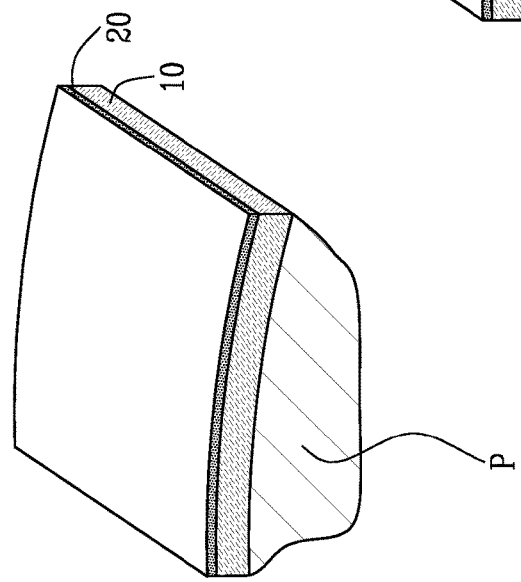
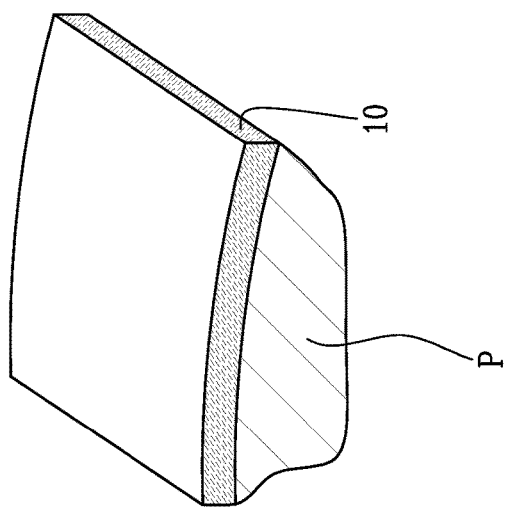

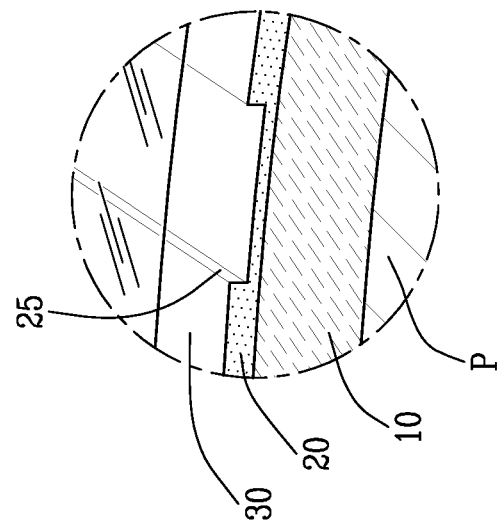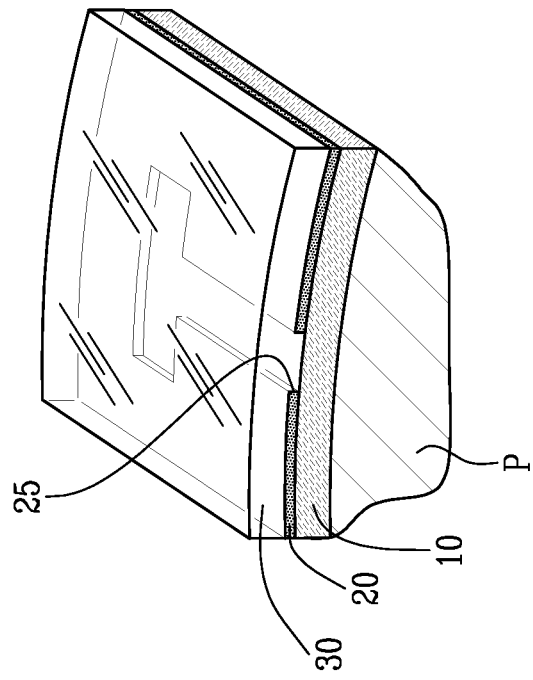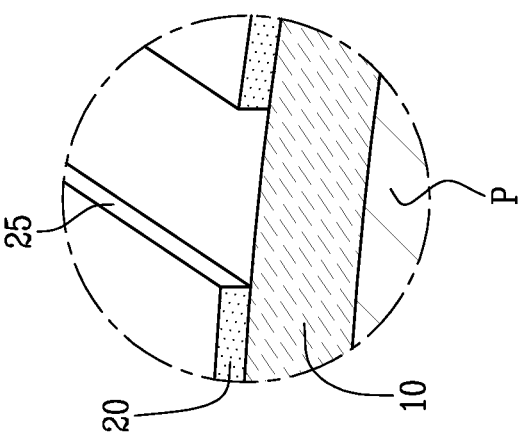

METHOD FOR SURFACE DECORATION OF ARTICLES

BACKGROUND OF THE INVENTION

This application claims priority to Italian Patent Application 102017000093249 filed Aug. 11, 2017, the entirety of which is incorporated by reference herein.

The present invention falls within the technical field of surface finishing processes. In particular, the present invention concerns a method for the surface decoration of articles, in particular of small three-dimensional objects such as perfume bottles, caps, and the like.

Finally, the present invention concerns an article with a metallic surface finishing, obtainable by the above-mentioned method.

Surface decoration methods by metallization are known. Metallization is a surface finishing process able to significantly transform the surface of the product embellishing it and enhancing its appearance, so that a simple moulded article looks like more sophisticated and more precious. The metallization makes it possible to perfectly imitate other types of colors, for example those obtained through the process of galvanic baths, thus allowing to aesthetically assimilate articles made of low-quality plastic or metallic material to articles of higher quality (for example, chromed or gilded).

For example, metallization methods by deposition by cathodic sputtering are known. This technique is achieved through the emission of atoms, ions or molecular fragments from a solid material, referred to as target, bombarded with a beam of energetic particles, generally an ion plasma. The ion plasma strikes the target which, due to the collision, releases atoms and particles that recondense on the surfaces of the article to be coated. This process is carried out in a vacuum chamber.

After the metallization step, the metallized surfaces can be further be subjected to a painting process in order to be coated with a transparent coating layer (colorless or of a desired color). The coating layer may have in particular the function of protecting the metallization layer from mechanical abrasion and/or from atmospheric agents (for example, from oxidation). The coating layer can also have the function of providing a particular final aesthetic effect to the metallized surfaces.

As a further decoration of the above-mentioned articles, or to apply logos, characters, drawings and other signs of recognition, it is known to engrave the metallization layer by means of material removal treatments and thus expose the underlying surface.

Disadvantageously, this type of engravings is often difficult to recognize, especially in low light conditions. In the modern market, manufacturers rely highly on aesthetics to improve the recognizability of their products and there is an increasing push in the search for original alternatives allowing them to stand out from the others. In particular, this is difficult in dark or poorly lit environments. Furthermore, in poorly lit places, such as bars and nightclubs, the above-mentioned articles are not very visible and this may hinder the personnel appointed to their use.

SUMMARY OF THE INVENTION

In this context, the technical task underlying the present invention is to overcome the limitations of the known technique.

In particular, the object of the present invention is to provide a method for the surface decoration of articles able to improve the visibility and recognizability of signs, drawings, logos and other engravings of various types impressed on metallized surfaces.

A further object of the invention is to provide the articles with particular optical characteristics, which can satisfy the market demand for innovative solutions aimed at increasing the attractiveness of certain products to the public.

According to one aspect, the present invention concerns a method for the surface decoration of articles, comprising steps A), B) and C).

Step A) comprises applying a base layer to the surface of a main body. The applied base layer comprises at least one photoluminescent additive suitable for conferring to it photoluminescence properties, in particular a fluorescence or a phosphorescence. Advantageously, the base layer acts as a primer for the application of following layers.

In compliance with the common semantic meaning, for the purposes of the present description and the attached claims the term "photoluminescence" and its derivatives refer to the physical phenomenon by which certain substances absorb, under the effect of an incident electromagnetic radiation, photons and then release them again at a different energetic state. The principle, in simple words, is the following: a source of energy, generally comprised of visible light or ultraviolet radiation, excites atoms, moving some electrons on a more external orbit. When these return to the inner orbit, they emit light. The time lapse between absorption and emission can be very short, for example around 10 nanoseconds (fluorescence). In other cases, this lapse can be extended to periods of a few minutes or hours (phosphorescence).

Step B), after step A), comprises applying on the base layer a metallization layer. The metallization layer is preferably formed by a process of deposition of metallic particles on the base layer. The metallization layer is preferably configured in order to render at least partially visible the photoluminescence of the above-mentioned base layer. In other words, the metallization layer is preferably configured to enable the emission of at least part of the radiations produced by the photoluminescence towards the exterior of the article.

Preferably, the metal particle deposition process comprises a physical vapor process of deposition, or PVD, in particular a sputtering deposition.

Step C), which follows step B), comprises applying a transparent coating layer on the above-mentioned base and metallization layers.

According to an embodiment, before step C), a material removal action is carried out, wherein a part of the metal particles of the metallization layer is removed according to a predetermined graphical pattern, to increase the visibility of the photoluminescence effect at said predetermined graphical pattern.

Preferably, the material removal action is accomplished by subjecting the metallization layer to a laser radiation treatment. In an embodiment, the above-mentioned material removal action completely removes the metallization layer at the above-mentioned predetermined graphical pattern, exposing the photoluminescence of the underlying base layer.

According to an alternative embodiment, the above-mentioned material removal action partially removes the metallization layer at the predetermined graphical pattern. The above-mentioned partial removal of material partially thins the metallization layer to make it permeable to the photoluminescence of the base layer at the predetermined graphical pattern.

According to a further embodiment, the material removal action completely removes the metallization layer at a first portion of the predetermined graphical pattern and partially removes it at a second portion of the above-mentioned predetermined graphical pattern.

According to an embodiment, the above-mentioned metal particles deposition process produces the above-mentioned metallization layer according to a thickness suitable to completely or almost completely hide the photoluminescence effect of said base layer. In this case, the photoluminescence of the base layer is visible only at the predetermined graphical pattern.

The thickness of the metallization layer, at least where it is desired to obtain a total or almost complete barrier of the preferably uniform photoluminescence, can be greater than 50 nanometres, indicatively ranging from 50 nanometres to 100 nanometres.

According to a further embodiment, the deposition process of the metal particles produces the metallization layer in order to allow the naked-eye perception of the photoluminescence effect of the base layer through the layer of metal particles, at least in low light conditions and/or in the presence of a predominantly ultraviolet light illumination.

For example, at least where it is desired to make photoluminescence visible through the metallization layer, the metallization layer itself can be made according to a thickness, preferably uniform, less than 50 nanometres.

In a preferred embodiment, the metallization layer has a thickness greater than 15 nanometers, preferably ranging from 20 to 35 nanometers. The metallization layer such configured is suitable to hide the photoluminescence effect of the base layer under normal ambient light, whether natural or artificial, leaving the metallic effect to prevail. Preferably, the metallization layer thus configured in any case allows the perception of the photoluminescence of the base layer in low light conditions and/or in ultraviolet light conditions.

According to a further aspect, the present invention relates to an article with a metallic surface finishing, having a main body and a plurality of superficial layers at a surface of the main body. The plurality of layers comprises: a base layer, a metallization layer and a coating layer.

The base layer comprises at least one photoluminescent additive suitable for conferring photoluminescence properties, in particular a fluorescence or a phosphorescence.

The metallization layer is external to said base layer and is preferably configured to make at least partially visible the photoluminescence. In other words, the metallization layer is preferably configured to enable the emission of at least part of the radiations produced by the photoluminescence towards the exterior of the article.

The coating layer is transparent and is external to the above-mentioned metallization layers. The protective coating layer may be colorless or pigmented, glossy or opalescent.

Preferably, the article with a metallic surface finishing has an engraving in the metallization layer according to a predetermined graphical pattern.

In an embodiment, the above-mentioned engraving crosses completely the metallization layer at the predetermined graphical pattern. In particular, the coating layer is in contact with the base layer at the predetermined graphical pattern.

In an alternative embodiment, the above-mentioned engraving has a depth less than the thickness of the metallization layer. In this case, the metallization layer is interposed between the base layer and the protective coating layer even at the predetermined graphical pattern.

In a further alternative embodiment, the article with a metallic surface finishing has a first engraving which crosses completely the metallization layer, and a second engraving having a depth less than the thickness of the metallization layer.

Preferably, the metallization layer is impervious to the photoluminescence of said base layer, except at the engraving described above. In other words, in a portion complementary to the predetermined graphical pattern, the metallization layer has a thickness impervious to the photoluminescence of the base layer.

In an alternative embodiment, the metallization layer is at least partially permeable to the photoluminescence of the base layer.

BRIEF DESCRIPTION OF THE DRAWINGS

Further characteristics and advantages of the present invention will become clearer from the indicative description, and therefore non-limiting, of a preferred, but not exclusive, embodiment of a method for surface decoration of articles, as illustrated in the appended figures, in which:

FIGS. 1 to 4 show a surface portion of an article with a metallic surface finishing in accordance with following operating steps of the article method of the present invention;

FIG. 3A shows a detail of the article of FIG. 3;

FIG. 5 shows the detail of FIG. 3A according to an alternative embodiment.

DETAILED DESCRIPTION

A method, object of the present invention, comprises the following steps A), B) and C).

By way of example, steps A), B), C) can be carried out on a finishing line as described in U.S. Pat. No. 9,487,857 and/or US-2017-0022599-A1, both on behalf of the same applicant.

In step A), a base layer 10 is applied to the surface of a main body "P" to be decorated (FIG. 1). Advantageously, the base layer 10 comprises at least one photoluminescent additive to conferring photoluminescence properties to it. In particular, in an embodiment, the above-mentioned additive confers fluorescence and/or phosphorescence properties to the base layer 10.

Advantageously, the base layer 10 acts as a primer for the following layers. The base layer 10 can, for example, be applied by a spray painting process, and following cross-linking and/or drying by UV and/or infrared radiation.

Subsequently, in step B), a metallization layer 20 is applied to the base layer 10 (FIG. 2) by a deposition process of metallic particles, preferably a process of physical vapor deposition (PVD). In the preferred embodiment, the above-mentioned deposition process is a deposition by cathodic sputtering.

According to a first embodiment, the metallization layer 20 obtained as a result of the deposition process has a thickness such as to make the metallization layer itself completely or almost completely impervious to the photoluminescence of the base layer 10. For this purpose, the thickness of the metallization layer 20, preferably uniform, can advantageously be greater than 50 nanometers, indicatively between 50 and 100 nanometers.

In a second embodiment, the metallization layer 20 obtained as a result of the deposition process has a thickness such as to render the metallization layer itself at least partially permeable to the photoluminescence of the base layer 10. For this purpose, the thickness of the metallization layer 20, preferably uniform, can advantageously be less than 50 nanometers. In order to make the metallic effect in any case perceivable in conditions of normal ambient light, natural or artificial, it is preferably provided that the metallization layer has a thickness greater than 15 nanometers. Preferably, to make photoluminescence visible through the metallization layer, the thickness of the latter is preferably between 20 and 35 nanometers.

In particular, in the form thus configured, the prevailing visual appearance in conditions of normal ambient light, natural or artificial, is the metallic effect conferred by the metallized layer, while the photoluminescence effect is less evident or absent. In other light conditions, for example low light conditions, complete darkness conditions (phosphorescent solution) or ultraviolet light exposure (fluorescent and/or phosphorescent solution) the luminescence effect is clearly visible and possibly prevailing over that of metallescence.

Following the production of the metallization layer 20, at least one engraving 25 can be made in the metallization layer 20 according to a predetermined graphical pattern. The engraving 25 is made by a material removal process, preferably with the aid of laser radiation.

According to a preferred embodiment, better illustrated in FIG. 3A, the engraving 25 completely crosses the metallization layer 20, in order to expose the base layer 10 making it directly visible through the incision 25. The light emitted by the photoluminescence therefore enhances the depicted graphical pattern, especially in particular light conditions such as, for example, low light conditions, complete darkness conditions (phosphorescent solution) or ultraviolet light exposure (fluorescent and/or phosphorescent solution). In conditions of normal ambient light, whether natural or artificial, the base layer will be clearly visible at the graphical pattern as chromatically different from the metallization layer 20, but not necessarily emphasized by the photoluminescence effect.

According to a further embodiment, illustrated in detail of FIG. 5, the engraving 25 locally thins the metallization layer 20, without completely exposing the base layer 10. More particularly, the metallization layer 20 may in this case have at least a greater thickness portion, indicatively greater than 50 nanometers, around the graphical pattern, and at least a reduced thickness portion, indicatively less than 50 nanometers and preferably between 20 and 35 nanometers, at the graphical pattern. In this way, the graphical pattern will be clearly perceivable in some light conditions such as, for example, low light conditions, complete darkness conditions or ultraviolet light exposure, and little or not at all perceivable in normal ambient light conditions, where the metallic appearance of the metallization layer 20 will prevail over the photoluminescence effect of the underlying base layer 10.

In step C), after step B), a transparent coating layer 30, also referred to as "top coating", is applied externally to the base 10 and metallization 20 layers. The transparency of the coating layer 30 allows the perception of the optical effects produced by the metallization layer 20, which simulate those of a completely metallic body, and by the photoluminescence of the base layer 10 at least at the engraving 25, if present.

Similarly to what has been said with reference to the base layer 10, also the coating layer 30 can be applied, for example, by spray painting, followed by cross-linking and/or drying by UV and/or infrared radiation.

In some embodiments, the substantially colorless coating layer 30 protects the metallization layer 20 and the base layer 10 without affecting its aesthetic properties.

In other embodiments, the coating layer 30 can be pigmented and/or opalescent so that, besides protecting the underlying layers, it provides the surface of the article produced with desired chromatic, gloss and/or shining properties.

The present invention also concerns an article with a metallic surface finishing, which can be achieved by the method described above, comprises a main body "P" and a plurality of superficial layers at its external surface.

The above-mentioned plurality of layers, illustrated in FIG. 4, comprises the base layer 10, applied on the surface of the main body "P" in direct contact with the same or a previous interposition of one or more additional layers. Advantageously, the base layer 10 comprises at least one photoluminescent additive which gives it photoluminescence properties. In particular, in an embodiment, the above-mentioned additive confers fluorescence and/or phosphorescence properties to the base layer 10. The base layer can indicatively have a thickness between 10 microns and 30 microns.

The above-mentioned plurality of layers further comprises a metallization layer 20, comprising a plurality of metallic particles. Preferably, the metallization layer 20 has an engraving 25 according to a predetermined graphical pattern, configured to increase the visibility of the base layer 10 through the above-mentioned graphical pattern, in order to enhance its optical and/or aesthetic qualities.

According to a first embodiment, the metallization layer 20 has, everywhere except that at the above-mentioned engraving 25, a thickness greater than 50 nanometers, indicatively between 50 nanometers and 100 nanometers, preferably uniform. This thickness makes the metallization layer 20 completely impervious to the photoluminescence of the base layer 10 everywhere except that at the above-mentioned engraving 25.

According to a second embodiment, the metallization layer 20, everywhere except that at the above-mentioned engraving 25 (if present), has a thickness of less than 50 nanometers, indicatively between 20 and 35 nanometers, preferably uniform. This thickness makes the metallization layer 20 partially permeable to the photoluminescence of the base layer 10. In particular, the photoluminescence effect in the form thus configured is little or not at all evident in some light conditions, such as natural light, and is more evident in other light conditions, for example low light conditions, complete darkness conditions. (phosphorescent embodiment) or ultraviolet light (fluorescent and/or phosphorescent embodiment).

At least when the thickness of the metallization layer 20 is less than 50 nanometers, engraving 25 is optional.

According to a preferred embodiment, the engraving 25 crosses completely the metallization layer 20, exposing the base layer 10 in order to make the photoluminescence visible through the engraving 25, so that the emitted light enhances the depicted graphical pattern.

According to an alternative embodiment, illustrated in detail of FIG. 5, the engraving 25 locally thins the metallization layer 10, without exposing completely the base layer 10. As described above, the photoluminescence of the base layer 10 is in this case perceivable only in certain light conditions, for example low light conditions, complete darkness or ultraviolet light exposure. In normal ambient light conditions, the metallic effect of the metallized layer 20 prevails.

The above-mentioned plurality of layers further comprises a transparent coating layer 30, also referred to as "top coating", externally to the base 10 and metallization 20 layers. The coating layer 30 can indicatively have a thickness ranging from 10 microns to 30 microns.

The coating layer 30, colorless or pigmented, glossy or opalescent, allows the perception of the optical effects linked to the metallization layer 20 which simulate those of a completely metallic body, and of the photoluminescence of the base layer 10 at least at the engraving 25, if present.

The present invention achieves the proposed objects, overcoming the limits and the drawbacks of the known technique. The photoluminescence properties of the base layer 10, indeed, shining through the metallization layer 20 or the engraving 25 and in combination with the metallized effect created by the metallization layer 20, create an original and particularly pleasing aesthetic effect. Thanks to the photoluminescent effect of the base layer 10, the identifiability of the articles and/or the recognisability of the graphic motifs, for example indications, logos or signs, engraved on the metallized surfaces, is increased. This effect is particularly noticeable in low light conditions, for example in bars and nightclubs.

The invention claimed is:

1. A method for surface decoration of articles, comprising the steps of:
   A) applying a base layer to a surface of a main body, the base layer comprising at least one photoluminescent additive suitable for conferring photoluminescence to the base layer;
   B) after step A), applying on the base layer a metallization layer configured to make at least partially visible the photoluminescence of the base layer; step B) comprising depositing metal particles on the base layer;
   C) after step B), applying a transparent coating layer on the base layer and metallization layer;
   D) prior to step C) performing a material removal action removing a portion of the metal particles in accordance with a predetermined graphical pattern.

2. A method according to claim 1, wherein the material removal action completely removes the metallization layer at the predetermined graphical pattern.

3. A method according to claim 1, wherein the material removal action partially removes the metallization layer at the predetermined graphical pattern to locally thin the metallization layer.

4. A method according to claim 1, wherein the material removal action is accomplished by subjecting the metallization layer to a laser radiation.

5. A method according to claim 1, wherein the depositing of the metallic particles causes the metallization layer to have a thickness greater than 50 nanometers.

6. A method according to claim 1, wherein the depositing of the metallic particles causes the metallization layer to have a thickness comprised between 20 nanometers and 35 nanometers.

* * * * *